(12) United States Patent
Breitling et al.

(10) Patent No.: US 10,793,428 B2
(45) Date of Patent: Oct. 6, 2020

(54) SENSOR ELEMENT HAVING LASER-ACTIVATED GETTER MATERIAL

(71) Applicant: Robert Bosch GmbH, Stuttgart (DE)

(72) Inventors: Achim Breitling, Reutlingen (DE); Mawuli Ametowobla, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 243 days.

(21) Appl. No.: 15/781,777

(22) PCT Filed: Oct. 12, 2016

(86) PCT No.: PCT/EP2016/074418
§ 371 (c)(1),
(2) Date: Jun. 6, 2018

(87) PCT Pub. No.: WO2017/097462
PCT Pub. Date: Jun. 15, 2017

(65) Prior Publication Data
US 2018/0362337 A1 Dec. 20, 2018

(30) Foreign Application Priority Data
Dec. 8, 2015 (DE) .......... 10 2015 224 506

(51) Int. Cl.
*B81C 1/00* (2006.01)
*B81B 7/00* (2006.01)
*G01P 1/02* (2006.01)

(52) U.S. Cl.
CPC ........ *B81C 1/00285* (2013.01); *B81B 7/0038* (2013.01); *G01P 1/02* (2013.01);
(Continued)

(58) Field of Classification Search
CPC .......... G01P 1/02; G01P 1/023; G01D 11/24; G01D 11/245; B81B 7/0038;
(Continued)

(56) References Cited

U.S. PATENT DOCUMENTS

| 2007/0065295 A1* | 3/2007 | Moraja .............. B81C 1/00285 417/48 |
| 2009/0174148 A1 | 7/2009 | Bischof et al. |

(Continued)

FOREIGN PATENT DOCUMENTS

| EP | 2004542 A1 | 12/2008 |
| WO | 2015/120939 A1 | 8/2015 |

OTHER PUBLICATIONS

International Search Report for PCT/EP2016/074418, dated Nov. 17, 2016.

*Primary Examiner* — Benjamin R Schmitt
(74) *Attorney, Agent, or Firm* — Norton Rose Fulbright US LLP; Gerard A. Messina

(57) ABSTRACT

A method for producing a micromechanical component having a substrate and cap, which is connected to the substrate and encloses a first cavity therewith. A first pressure prevails in the first cavity, and a first gas mixture having a first chemical composition is enclosed, and an access opening is provided in the substrate or cap, which connects the first cavity to an environment of the micromechanical component, and then the first pressure and/or the first chemical composition is adjusted in the first cavity, and finally, the access opening is sealed with a laser by introducing energy/heat into an absorbing part of the substrate or cap, and a getter, introduced into the first cavity prior to the third task, is sealed with the laser radiation, and a getter, introduced into the first cavity prior to the third task, is activated at least partially with the laser radiation, during the third task.

11 Claims, 4 Drawing Sheets

(52) U.S. Cl.
CPC ............... *B81B 2201/0235* (2013.01); *B81B 2201/0242* (2013.01); *B81B 2203/0315* (2013.01); *B81C 2203/0145* (2013.01)

(58) Field of Classification Search
CPC .... B81B 2203/0315; B81B 2201/0242; B81B 2201/0235; B81C 1/00285; B81C 2203/0145
USPC .......................................... 73/431, 493, 511
See application file for complete search history.

(56) References Cited

U.S. PATENT DOCUMENTS

| | | |
|---|---|---|
| 2011/0114840 A1 | 5/2011 | Yamazaki et al. |
| 2011/0209815 A1 | 9/2011 | Aono et al. |
| 2014/0022718 A1 | 1/2014 | Yamazaki et al. |

* cited by examiner

SENSOR ELEMENT HAVING LASER-ACTIVATED GETTER MATERIAL

FIELD OF THE INVENTION

The present invention is based on a method for a sensor element having laser-activated getter material.

BACKGROUND INFORMATION

Such a method is discussed in patent publication WO 2015/120939 A1. If a certain internal pressure is desired inside a cavity of a micromechanical component or if a gas mixture having a certain chemical composition is to be enclosed in the cavity, then the internal pressure or the chemical composition is frequently adjusted when encapsulating the micromechanical component or during the bonding process between a substrate wafer and a cap wafer. During the encapsulation, for example, a cap is connected to a substrate, whereby the cap and the substrate jointly enclose the cavity. By adjusting the atmosphere or the pressure and/or the chemical composition of the gas mixture present in the environment during the encapsulation, it is therefore possible to adjust the specific internal pressure and/or the specific chemical composition inside the cavity.

Using the method from WO 2015/120939 A1, it is believed to be possible to selectively adjust an internal pressure inside a cavity of a micromechanical component. More specifically, this method may be used to produce a micromechanical component that includes a first cavity, a first pressure and a first chemical composition being adjustable inside the first cavity, which differ from a second pressure and from a second chemical composition at the time of the encapsulation.

In the method for the selective adjustment of an internal pressure inside a cavity of a micromechanical component according to the document WO 2015/120939 A1, a narrow access channel to the cavity is created in the cap, in the cap wafer, or in the substrate or the sensor wafer. The cavity is then flooded with the desired gas and the desired internal pressure by way of the access channel. Finally, the region around the access channel is locally heated with the aid of a laser, the substrate material locally liquefying and hermetically sealing the access channel when solidifying.

A very low pressure, which is less than 1 mbar, for instance, is enclosed in rotation-rate sensors, for example. This is the case because a portion of the movable structures in rotation-rate sensors is driven in a resonant manner. At a low pressure, due to the low damping, it is very easy to excite a vibration using relatively low voltages.

In the case of acceleration sensors, on the other hand, there is no desire to induce vibrations in the sensor, which would be possible when an external acceleration is applied. These sensors are therefore operated at a higher internal pressure. The internal pressure of an acceleration sensor is 500 mbar, for instance.

Another method for the selective adjustment of an internal pressure inside a cavity of a micromechanical component is discussed in European patent EP 2 004 542 B1.

SUMMARY OF THE INVENTION

It is an object of the present invention to provide a method for producing a micromechanical component, which is mechanically robust and has a long service life in comparison with the related art, and to do so in an uncomplicated and economical manner in comparison with the related art.

Furthermore, it is an object of the present invention to provide a compact, mechanically robust micromechanical component that has a long service life when compared to the related art. According to the present invention, this particularly applies to a micromechanical component that includes a (first) cavity. With the aid of the method according to the present invention as well as the micromechanical component according to the present invention, it is furthermore also possible to realize a micromechanical component in which a first pressure and a first chemical composition are adjustable in the first cavity, and a second pressure and a second chemical composition are able to be adjusted in a second cavity. For example, such a method is intended for the production of micromechanical components where it is advantageous if a first pressure is enclosed inside a first cavity and a second pressure is enclosed inside a second cavity, the first pressure differing from the second pressure. For instance, this is the case when a first sensor unit for a rotation-rate measurement and a second sensor unit for an acceleration measurement are to be integrated into a micromechanical component. In particular, it is the object of the present invention to provide for high quality over the service life of the micromechanical component.

This objective is achieved in that a getter, which is introduced into the first cavity prior to the third method step, is at least partially activated during the third method step with the aid of laser radiation that is generated by the laser.

This provides a simple and cost-effective method for producing a micromechanical component by which the first pressure inside the first cavity, especially if the first cavity is a rotation-rate sensor cavity, is able to be kept essentially constant or is able to be stabilized across the service life, or by which the first pressure is able to be further reduced following a provisional adjustment of the first pressure. For example, this is achieved in that the getter binds small quantities of gas that degas from the materials within the first cavity over the service life or that enter the first cavity through gas diffusion, e.g., through the substrate or through the cap or through a bond frame or bond web between the first cavity and the second cavity.

The method according to the present invention is also advantageous because the introduced material, i.e. the getter material or the activated getter, has to have only a slight adsorption capacity or sorption capacity inasmuch as it has to adsorb merely small quantities of gas that penetrate the cavity after it has been hermetically sealed. This particularly is the case due to the execution of the first, second and third method steps since the first pressure is able to be preset in this manner and the getter only has to take care of the further adjustment of the first pressure. In particular the use of getters or of getter materials having a low gas-absorption capacity in comparison with the related art is therefore an option. According to the present invention it is provided, for instance, that the number of particles to be maximally adsorbed by the getter per getter area is $10^{21}$ or $10^{20}$ or $10^{19}$ or $10^{18}$ or $10^{17}$ or $10^{16}$ or $10^{15}$ or $10^{14}$ or $10^{13}$ or $10^{12}$ or $10^{11}$ or $10^{10}$ or $10^9$ or $10^8$ or $10^7$ or $10^6$ 1/m².

The method according to the present invention is particularly advantageous in comparison with a method in which different pressures p1/p2 are required inside a cavity of a rotation-rate sensor p1 and inside a cavity of an acceleration sensor p2. In the cavity of a rotation-rate sensor, a high pressure that is initially enclosed in both cavities is subsequently brought to a low pressure with the aid of a getter and by activating the getter via a temperature step inside the cavity of the rotation-rate sensor. In comparison with such a method, the method according to the present invention is relatively simple and cost-effective.

In addition, the method according to the present invention is advantageous if the sealing of a MEMS structure situated in the first cavity by a cap wafer is carried out at high temperatures, e.g., using seal glass as the connection material or using different other bonding materials or bonding systems such as eutectic aluminum-germanium (AlGe) or copper-tin-copper (CuSnCu) systems. Even if the bonding method is carried out under a vacuum and at high temperatures, gases evaporate out of the bonding system at a high temperature and cause a residual pressure inside the cavity that is independent of the very low pressure prevailing inside the cavity during the bonding method. With the aid of the method according to the present invention, this residual pressure is able to be considerably reduced in comparison with the related art.

The method according to the present invention is also advantageous if surfaces of sensors or of sensor cores are provided with organic coatings that prevent movable structures from adhering to one another, and if these organic coatings degrade at the high temperatures in the bonding process, for example, and are no longer fully effective. The method according to the present invention is able to counteract an at least partial release of the organic layers inside the cavity and a consequently increased internal pressure after the MEMS element has been sealed, and to do so in a simple and cost-effective manner.

The method according to the present invention is also especially advantageous if degassing of inert gases or of other gases from the wafers or from the substrate or the cap or from a bonding layer occurs during the bonding process, when the inert gases or other gases are unable to be pumped or can only be inadequately pumped through the getter, because the method according to the present invention makes it possible to adjust the first pressure temporally after the bonding process with the aid of the access opening. As a result, such degassing is able to be effectively counteracted by the method according to the present invention. This is advantageous because the degassing of inert gases or other gases that cannot be pumped or that can only be pumped inadequately via the getter would restrict the minimally achievable pressure, and this degassing could cause a strong, undesired variance of the internal pressure even at higher pressures.

The term 'getter' in the context of the present invention describes a chemically reactive material that is used to maintain a vacuum for as long as possible. For instance, gas molecules enter into a direct chemical bond with the atoms of the getter material at the surface of the getter. Alternatively or additionally, however, it is also provided that the gas molecules are retained on the getter material by way of sorption. This "traps" the gas molecules in or at the surface of the getter material. In the context of the present invention, a distinction must be made between an activated getter and an inactivated getter, the activated getter having a higher trapping rate than an inactivated getter. In this case, a trapping rate describes a number of gas molecules that are trapped in or at the surface of the getter material per time unit, e.g., per second. In addition, according to the present invention, a distinction has to be made between a reversible getter and an irreversible getter. In this case, a reversible getter according to the present invention has at least partially or predominantly reversible getter material, and an irreversible getter has at least partially or predominantly irreversible getter material. However, according to the present invention it is also provided that both a reversible getter and an irreversible getter have at least partially reversible getter material and at least partially irreversible getter material in each case. According to the present invention, a reversible getter material is a getter material that essentially traps or absorbs gas molecules in or at the surface of the getter material at a first instant or during a first time period, and which essentially releases or emits trapped gas molecules from or at the surface of the getter material at a second instant or during a second time period. According to the present invention, "essentially traps or absorbs", for example, is to be understood in such a way that the trapping rate is greater than a release rate or that a first sum of an adsorption rate and an absorption rate is greater than a desorption rate. According to the present invention, "essentially release or emit", for example, is to be understood in such a way that the trapping rate is lower than the emission rate or that the first sum is smaller than the desorption rate. In this context an adsorption rate describes the number of gas molecules trapped at the surface of the getter material per time unit, e.g., per second. An absorption rate, for instance, is to be understood as the number of gas molecules trapped in the surface of the getter material or in the volume of the getter material per time unit, for example. In this instance, a release rate or desorption rate, for example, describes the number of gas molecules that are released or emitted from or at the surface of the getter material per time unit, such as per second. According to the present invention, a reversible getter is essentially able to regenerate, or is able to be set into an initial state having a high absorption tendency or adsorption tendency. According to the present invention, an absorption tendency or an adsorption tendency describes the provision of a high absorption or adsorption rate in the presence of corresponding gas molecules.

According to the present invention, a particle may describe an atom or a collection of atoms, e.g., a molecule or multiple molecules. In connection with the present invention, the particle is in a gaseous, liquid or solid state of aggregation or is part of a gaseous, liquid or solid phase, and includes at least one phase boundary interface with its environment. More specifically, a particle within the context of the present invention is a small body at the scale of the micromechanical component, i.e. a body that at most has an extension of $\frac{1}{10}$th of a maximum extension of the micromechanical component.

In the context of the present invention, the term 'micromechanical component' is to be understood as encompassing both micromechanical components and micro-electromechanical components.

The present invention may be provided for the production of a micromechanical component, or for a micromechanical component that includes a cavity. However, the present invention is also provided for a micromechanical component including two cavities or more than two, e.g., three, four, five, six, or more than six cavities, for example.

The access opening may be sealed with the aid of a laser in that energy or heat is introduced into a portion of the substrate or the cap that absorbs this energy or this heat. In the process, energy or heat may be introduced into the absorbing part of the substrate or the cap of a plurality of micromechanical components that, for example, are jointly produced on a wafer, the introduction being carried out temporally one after the other. However, it is alternatively also provided to introduce the energy or heat into the respective absorbing part of the substrate or the cap of multiple micromechanical components in a temporally parallel manner, e.g. using a plurality of laser beams or laser devices.

Advantageous embodiments and further developments of the present invention may be gathered from the dependent claims and from the description with reference to the drawing.

According to one further development, the cap encloses a second cavity together with the substrate, a second pressure prevailing in the second cavity and a second gas mixture that has a second chemical composition being enclosed.

According to one further development, the substrate is connected to the cap in a fourth method step in such a way that the cavity is hermetically cut off from the environment, the fourth method step being carried out prior to or subsequent to the first method step. This advantageously makes it possible to develop the access opening either before or after the substrate is connected to the cap.

According to one further development, a pumping step and/or a heating step and/or a purging step and/or a purification step is/are carried out in a fifth method step. This advantageously allows for the removal of gases and/or particles from the first cavity to the environment of the micromechanical component and/or for a selective surface conditioning of the surfaces of the substrate and/or the cap facing the first cavity.

According to one further development, the fifth method step is carried out temporally following the first method step and temporally prior to the third method step. This advantageously makes it possible to remove from the first cavity not only gases and/or particles that have ended up inside the first cavity due to the bonding process, but also gases and/or particles that have reached the first cavity because of the creation of the access opening, and to bring them into the environment of the micromechanical component.

A further subject matter of the present invention is a micromechanical component that includes a substrate and a cap, which is connected to the substrate and encloses a first cavity together with the substrate, a first pressure prevailing in the first cavity and a first gas mixture having a first chemical composition being enclosed therein, and the substrate or the cap including a sealed access opening. The micromechanical component has a getter, which is situated in the first cavity and is at least partially activated by laser radiation generated during the sealing of the access opening. This advantageously provides a compact, mechanically robust and cost-effective micromechanical component featuring an adjusted first pressure. The mentioned advantages of the method according to the present invention correspondingly apply also to the micromechanical component according to the present invention.

According to one further development, the activated getter is disposed in such a way that a first projection of the activated getter onto a main extension plane of the micromechanical component, and a second projection of the access opening onto the main extension plane overlap at least partially. This advantageously makes it possible to activate the getter at least partially with the aid of laser radiation that is essentially directed perpendicular to the main extension plane and enters through the access opening.

According to one further development, the substrate and/or the cap include(s) silicon. This advantageously makes it possible to produce the micromechanical component employing production methods from layer technology that are known from the related art.

According to one further development, the activated getter has an irreversible getter material and/or a reversible getter material. In this way, it is advantageously possible that the getter does not release absorbed particles into the cavity again, and/or at least partially releases selectively absorbed particles into the cavity again.

More specifically, the method according to the present invention is advantageous because, due to the use of a reversible getter, the reversible getter need not be available in a chemically inert state prior to the encapsulation or prior to the bonding process. In other words, the reversible getter need not be in an inactivated state prior to the bonding process but may already be in an activated state prior to the bonding process. As a result, according to the method of the present invention, the getter does not have to be activated in a separate temperature step following the encapsulation or following the bonding process. Instead, the reversible getter may be active immediately after the deposition of the reversible getter. For example, this allows for the use of materials as getter materials that are not used in methods that are known from the related art.

According to one further development, the cap encloses a second cavity with the substrate, a second pressure prevailing in the second cavity and a second gas mixture having a second chemical composition being enclosed therein. This advantageously provides a compact, mechanically robust and cost-effective micromechanical component, which has an adjusted first pressure and second pressure.

According to one further development, the first pressure is less than the second pressure, and a first sensor unit for a rotation-rate measurement is situated in the first cavity and a second sensor unit for an acceleration measurement is situated in the second cavity. This advantageously provides a mechanically robust micromechanical component for a rotation-rate measurement and an acceleration measurement, which features optimal operating conditions both for the first sensor unit and the second sensor unit.

Identical components in the various figures have been provided with matching reference numerals and are therefore generally also denoted or mentioned only once.

DETAILED DESCRIPTION

Figure 1:
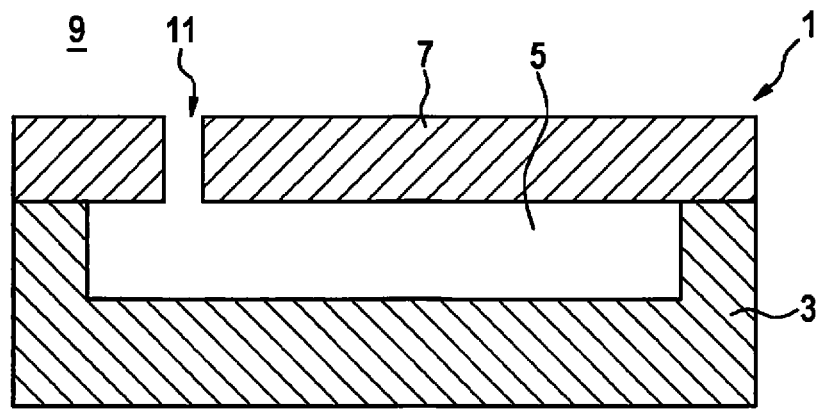
FIG. 1 shows a schematized illustration of a micromechanical component having an open access opening according to one exemplary embodiment of the present invention.
Figure 2:
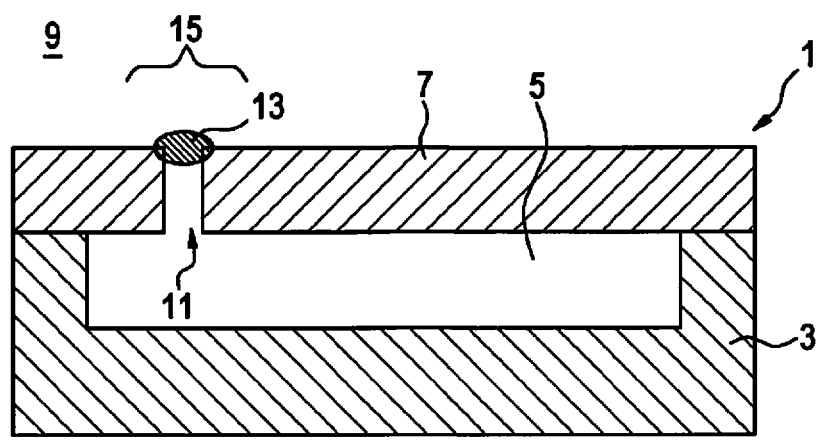
FIG. 2 shows a schematized illustration of the micromechanical component according to FIG. 1 having a sealed access opening.

FIG. 1 and FIG. 2 show a schematized illustration of a micromechanical component 1 having an open access opening 11 in FIG. 1 and a sealed access opening 11 in FIG. 2 according to an exemplary embodiment of the present invention.

Micromechanical component 1 includes a substrate 3 and a cap 7. Substrate 3 and cap 7 are connected to each other, which may be hermetically, and jointly enclose a first cavity 5. For example, micromechanical component 1 is configured in such a way that substrate 3 and cap 7 additionally and jointly enclose a second cavity. However, the second cavity is not shown in FIG. 1 or in FIG. 2.

For instance, a first pressure prevails inside first cavity 5, in particular when access opening 11 is sealed as shown in FIG. 2. In addition, a first gas mixture having a first chemical composition is enclosed inside first cavity 5. Moreover, a second pressure prevails inside the second cavity and a second gas mixture having a second chemical composition is enclosed inside the second cavity. Access opening 11 may be disposed in substrate 3 or in cap 7. In this particular exemplary embodiment, access opening 11 is situated in cap 7 by way of example. However, according to the present invention, it may alternatively also be the case that access opening 11 is disposed in substrate 3.

For instance, it is provided that the first pressure in first cavity 5 is lower than the second pressure in the second cavity. It is also provided, for example, that a first micromechanical sensor unit for a rotation-rate measurement, which is not shown in FIG. 1 or FIG. 2, is disposed inside first cavity 5, and that a second micromechanical sensor unit for an acceleration measurement, which is not shown in FIG. 1 or FIG. 2, is situated inside the second cavity.

Figure 3:
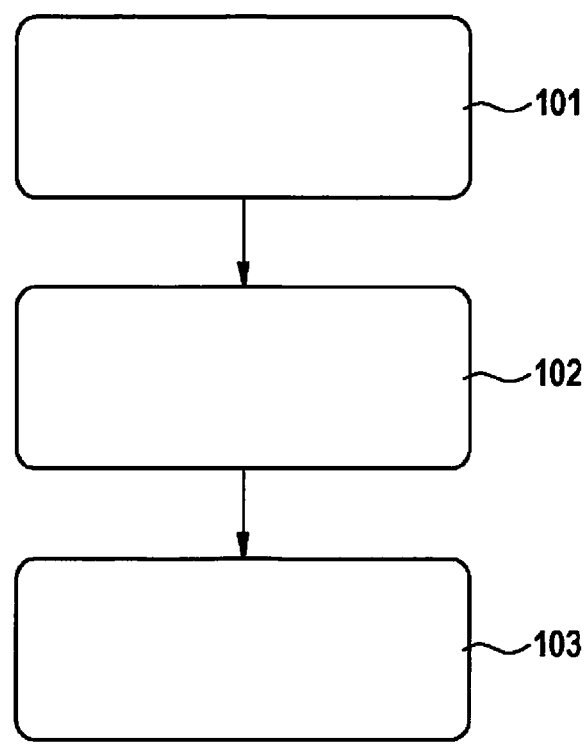
FIG. 3 shows a schematized illustration of a method for producing a micromechanical component according to an exemplary embodiment of the present invention.

A method for producing micromechanical component 1 according to an exemplary embodiment of the present invention is schematically shown in FIG. 3. In this context, in a first method step 101, access opening 11, in particular a narrow access opening, which connects first cavity 5 with an environment 9 of micromechanical component 1, is configured in substrate 3 or in cap 7. FIG. 1 exemplarily illustrates micromechanical component 1 subsequent to first method step 101. In addition, in a second method step 102, the first pressure and/or the first chemical composition is/are adjusted inside first cavity 5, or first cavity 5 is flooded with the desired gas and the desired internal pressure via the access channel. In addition, for instance, in a third method step 103, access opening 11 is sealed with the aid of a laser by the introduction of energy or heat into an absorbing part of substrate 3 or cap 7. As an alternative, for instance, it is also provided that in third method step 103, the region around the access channel may be heated only locally by a laser and the access channel is hermetically sealed. This advantageously makes it possible to provide the method according to the present invention also together with energy sources other than a laser for the sealing of access opening 11. FIG. 2 exemplarily shows micromechanical component 1 following third method step 103.

Temporally after third method step 103, mechanical stresses may occur in a lateral region 15, exemplarily shown in FIG. 2, at a surface of cap 7 facing away from cavity 5 and also in the depth, perpendicular to a projection of lateral region 15 onto the surface, i.e. along access opening 11 and in the direction of first cavity 5, of micromechanical component 1. These mechanical stresses, especially local mechanical stresses, prevail in particular in the area of a boundary surface between a material region 13 of cap 7 that transitions to a liquid state of aggregation in third method step 103 and to a solid state of aggregation following third method step 103 and seals access opening 11, and a residual region of cap 7 that remains in a solid state of aggregation during third method step 103. In FIG. 2, material region 13 of cap 7 sealing access opening 11 should be considered only as a schematic depiction, in particular with regard to its lateral extension or form that extends parallel to the surface, and especially with regard to its extension or configuration running perpendicular to the lateral extension, especially perpendicular to the surface.

In addition, for example, a getter 503, which is introduced into first cavity 5 prior to third method step 103 shown in FIG. 3, is at least partially activated during third method step 103 with the aid of laser radiation 505 produced by the laser. In other words, access hole 11 is sealed using laser radiation 505. A defined atmosphere is maintained inside first cavity 5 and/or in environment 9, for example, until the sealing takes place, or temporally before access hole 11 is closed. In the process, adsorption material 503 is activated 509 by laser radiation 507 that falls through access hole 11 into first cavity 5 at the beginning of the sealing process, for instance before cap material 7 or the silicon is fused thereon and access opening 11 closes up.

In a fourth method step, for example, substrate 3 is connected to cap 7 in such a way that cavity 5 is hermetically cut off from environment 9, the fourth method step being carried out prior to or following first method step 101.

Figure 4:
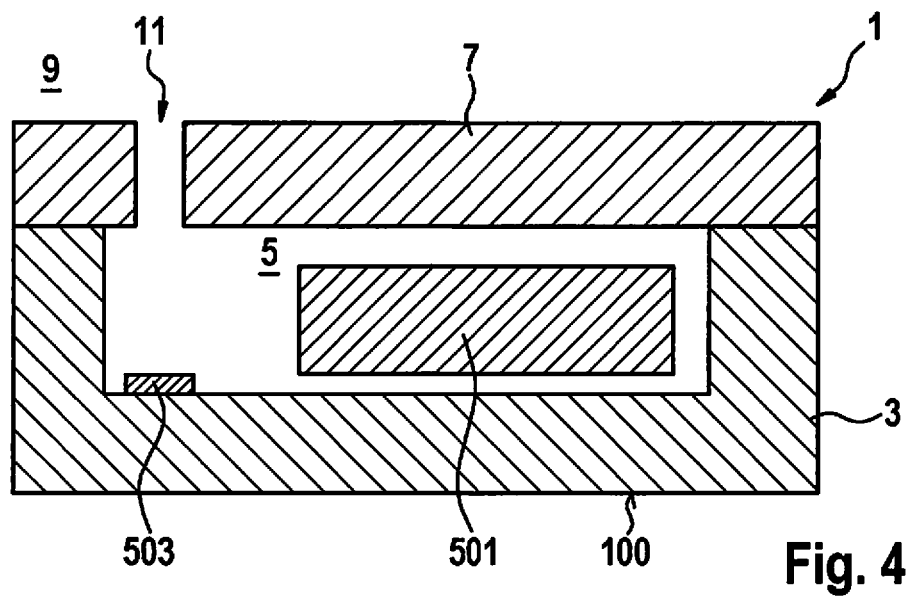
FIG. 4 shows a schematized illustrations of a micromechanical component at an instant of the method of the present invention, according to a further exemplary embodiment of the present invention.
Figure 5:
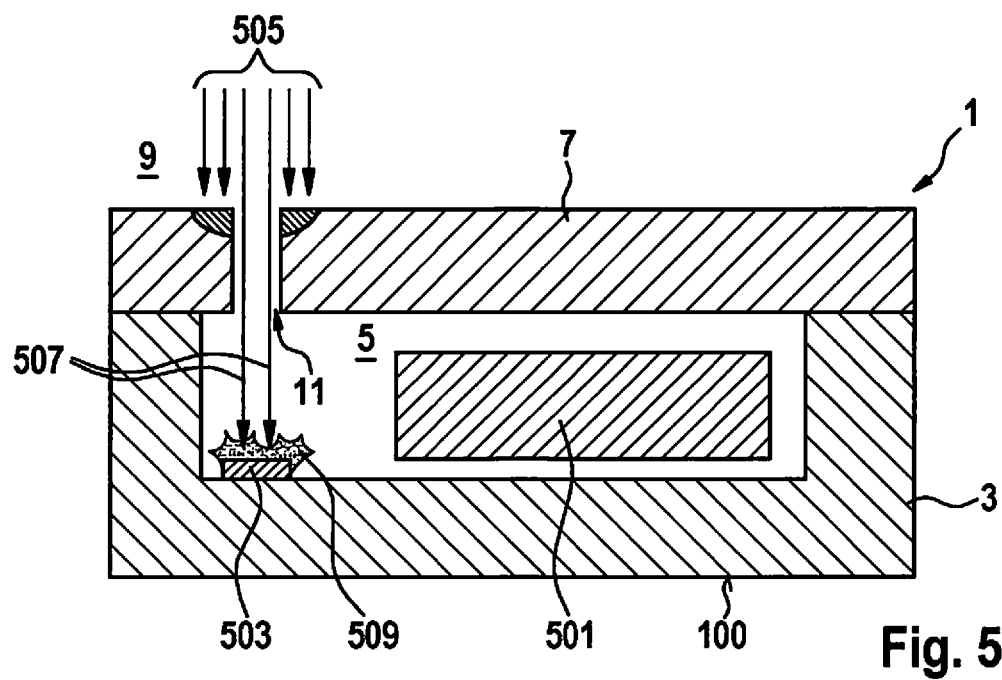
FIG. 5 shows a schematized illustrations of a micromechanical component at a different instant of the method of the present invention, according to a further exemplary embodiment of the present invention.
Figure 6:
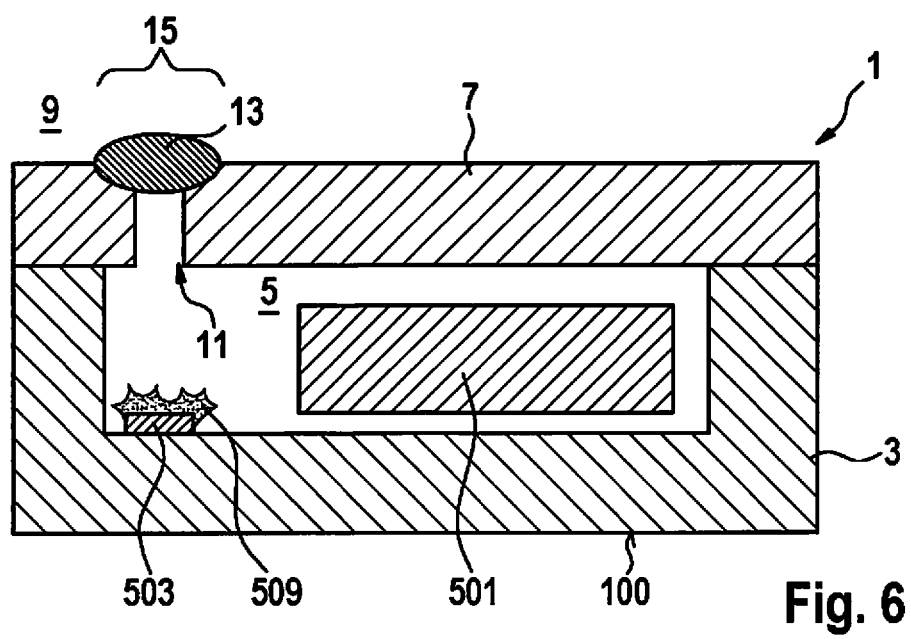
FIG. 6 shows a schematized illustrations of a micromechanical component at a different instant of the method of the present invention, according to a further exemplary embodiment of the present invention.

In schematized illustrations, FIG. 4, FIG. 5 and FIG. 6 show a micromechanical component at different points in time of the method of the present invention according to one further exemplary embodiment of the present invention. By way of example, micromechanical component 1 has getter 503, which is disposed inside first cavity 5 and is at least partially activated by laser radiation 505 generated during the sealing of access opening 11. Activated getter 503 is disposed in such a way, for instance, that a first projection of activated getter 503 onto a main extension plane 100 of micromechanical component 1, and a second projection of access opening 11 onto main extension plane 100 overlap at least partially. In addition, activated getter 503 has an irreversible getter material, for example, and/or a reversible getter material. In FIG. 4, FIG. 5, and FIG. 6, a MEMS element 501 is shown by way of example. MEMS element 501 is a first sensor unit for a rotation-rate measurement, for instance. In addition, a laser-beam component 507 of laser radiation 505 is shown in FIG. 5, which falls through access opening 11 into cavity 5 and onto getter 503 to be activated, or which interacts with getter 503 to be activated and induces getter 503 to a transition from an inactivated state to an activated state. Activated getter 503 in FIG. 5 and FIG. 6 is to be distinguished from inactivated getter 503 in FIG. 4 in that activated getter 503 is shown as activated with the aid of reference numerals 509 in FIG. 5 and FIG. 6.

For example, a material is introduced into the first cavity that has an adsorption capacity for reactive gases such as oxygen, hydrogen, etc. and is able to be activated by being irradiated by a laser. For instance, the material is introduced into first cavity 5, or is applied onto a surface of substrate 3 or cap 7 facing first cavity 5, temporally before the bonding step between substrate 3 and cap 7. To adjust the desired internal pressure or the first pressure inside first cavity 5, the cavity is retroactively, e.g., in first method step 101, provided with a ventilation opening or with access opening 11, which allows for a pressure adjustment inside first cavity 5. For instance, the pressure adjustment takes place, or may take place, at an increased temperature or at a temperature that is higher than 20° C. or 30° C., or 40° C., or 50° C., or 60° C., or 70° C., or 80° C., or 90° C., or 100° C., or 200° C., or 300° C., or 400° C., or 500° C., or 1000° C., which allows for the evaporation of residual gases that may possibly be present inside the cavity. Following the temperature step, for example, the ventilation hole or access opening 11 is sealed with the aid of a laser, i.e. third method step 103 is carried out, and the desired internal pressure is adjusted. At the same time, for instance, the adsorption material or getter 503 is activated (e.g., by evaporation) by laser radiation 507, which falls through the ventilation hole or the access opening into the chamber, i.e. first cavity 5, at the start of the sealing process (that is, for example, before substrate 3 or cap 7 or the silicon is at least partially fused). As illustrated in FIG. 5, FIG. 6, and FIG. 7, the adsorption material is situated underneath the ventilation hole or access opening 11 at the bottom of first cavity 5 for this purpose. The material or getter 503 or the getter material and the sealing process are adapted to one another in such a way that the energy quantity irradiated by the laser at the start of the sealing process is sufficient to activate the material or to transfer the getter to an activated state. Following this process in time, the getter material absorbs residual gas that possibly enters due to leakages leakages or that is still present inside the chamber across the service life of the component.

According to the present invention, the introduced material or the getter material or the activated getter merely needs to have a slight adsorption or sorption capacity since it has to absorb only small quantities of gas that penetrate after the cavity has been hermetically sealed. The only low sorption capacity that is required is achievable by carrying out first method step 101, second method step 102, and third method step 103 in the method according to the present invention, which therefore allows for a selective adjustment of the first pressure following the bonding process. Another advantage is that the activation of the material requires no additional process steps, e.g., a process step at an increased temperature. For example, the getter counteracts a change in the gas composition or in the first chemical composition caused by influence factors that occur temporally after the wafer process, such as higher temperatures during the use of the sensor element.

It is also provided, for instance, that a pumping step and/or a heating step and/or a purging step and/or a purification step is/are carried out in a fifth method step. In this context, it is also provided, for example, that the fifth method step takes place temporally after the first method step and temporally before third method step 103.

In other words, after the creation of access hole 11 or multiple access holes 11, first cavity 5 is initially evacuated in order to remove, for example, inert gases from first cavity 5. Temporally thereafter, for instance, access holes 11 are sealed under a defined atmosphere and the getter is activated again. According to the present invention, it is also provided that the getter is activated temporally after the third method step, for instance via a tempering step or a further method step at an increased temperature. It is also provided, for instance, that heating, pumping and purging or purification cycles are used temporally after the creation of access holes 11. As a result, it is possible, for example, to selectively adjust the degassing of undesired gases or a selective surface conditioning.

Additional advantages of the method according to the present invention and the micromechanical component 1 according to the present invention over the related art are the following:

Different sensor cores having different requirements with regard to the internal pressure are able to be easily combined on one chip;

Various internal pressures, even very small internal pressures, are adjustable inside a MEMS cavity;

After the cavity has been sealed, residual quantities of gas possibly penetrating due to leakages or having remained inside the cavity are able to be reliably trapped over the service life;

The technology is simple, robust, and cost-effective.

The production method is compatible with the known production processes, e.g., also with encapsulation processes such as with aluminum-germanium (AlGe) eutectic bonding and with seal glass bonding.

The method according to the present invention allows for the sealing of the MEMS cavity in a particularly stable manner across the service life.

In combination sensors such as in a micromechanical component 1 including a first sensor unit for a rotation-rate measurement and a second sensor unit for an acceleration measurement, getter materials that have a low sorption capacity may be used since it is possible to provide a very low pressure inside first cavity 5 of the rotation-rate sensor already prior to the sealing, via the access hole or access opening 11.

In combination sensors, very low quantities of getter materials may be used because a very low pressure may already be provided inside the cavity of the rotation-rate sensor via the access hole prior to the sealing.

In combination sensors, getter materials that are activated by laser radiation, independently of the bonding method, are able to be used. The use of irreversible and regenerative getter materials is possible.

Gases that degas during the bonding process may first be pumped out via the access hole before the getter is activated.

What is claimed is:

1. A method for producing a micromechanical component, including a substrate and a cap, which is connected to the substrate and encloses a cavity with the substrate, a pressure prevailing inside the cavity and a gas mixture having a chemical composition being enclosed, the method comprising:
providing, in a first task, an access opening in the substrate or in the cap, which connects the cavity to an environment of the micromechanical component;
adjusting, in a second task, the pressure and/or the chemical composition in the cavity; and
sealing, in a third task, the access opening with a laser by introducing energy or heat into an absorbing part of the substrate or the cap;
wherein a getter material, introduced into the cavity prior to the third task, is at least partially activated with laser radiation generated by the laser during the third task.

2. The method of claim 1, further comprising:
connecting, in a fourth task, the substrate to the cap so that the cavity is hermetically cut off from the environment, the fourth task being performed prior to or following the first task.

3. The method of claim 1, further comprising:
performing, in a fifth task, at least one of a pumping, a heating step, a purging, and/or a purification.

4. The method of claim 3, wherein the fifth task is performed temporally after the first task and temporally before the third task.

5. A micromechanical component, comprising:
a substrate;
a cap, which is connected to the substrate, and which encloses a cavity with the substrate, wherein a pressure prevails inside the cavity and a gas mixture having a chemical composition is enclosed, wherein the substrate or the cap includes a sealed access opening, and wherein the micromechanical component has a getter, which is disposed in the cavity and is at least partially activated by laser radiation generated during the sealing of the access opening.

6. The micromechanical component of claim 5, wherein the activated getter is situated so that a projection of the activated getter onto a main extension plane of the micromechanical component and a second projection of the access opening onto the main extension plane overlap at least partially.

7. The micromechanical component of claim 5, wherein the substrate and/or the cap includes silicon.

8. The micromechanical component of claim 5, wherein the activated getter has an irreversible getter material.

9. The micromechanical component of claim 5, wherein the cap encloses a second cavity with the substrate, and wherein a second pressure prevails inside the second cavity and a second gas mixture having a second chemical composition is enclosed.

10. The micromechanical component of claim 9, wherein the pressure is lower than the second pressure, and wherein a sensor unit for a rotation-rate measurement is disposed inside the cavity, and a second sensor unit for an acceleration measurement is disposed in the second cavity.

11. The micromechanical component of claim 5, wherein the activated getter has a reversible getter material.

* * * * *